(12) United States Patent
Chen et al.

(10) Patent No.: US 8,972,908 B2
(45) Date of Patent: Mar. 3, 2015

(54) METHOD FOR ELECTRON BEAM PROXIMITY CORRECTION WITH IMPROVED CRITICAL DIMENSION ACCURACY

(71) Applicant: Taiwan Semiconductor Manufacturing Company, Ltd., Hsin-Chu (TW)

(72) Inventors: Cheng-Hung Chen, Zhubei (TW); Jaw-Jung Shin, Hsinchu (TW); Shy-Jay Lin, Jhudong Township (TW); Wen-Chuan Wang, Hsinchu (TW); Pei-Yi Liu, Changhua (TW); Burn Jeng Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/954,635

(22) Filed: Jul. 30, 2013

(65) Prior Publication Data

US 2015/0040079 A1    Feb. 5, 2015

(51) Int. Cl.
    *G06F 17/50*    (2006.01)
(52) U.S. Cl.
    CPC ................................. *G06F 17/5081* (2013.01)
    USPC ....................................................... 716/53
(58) Field of Classification Search
    USPC .................................................. 716/100, 53
    See application file for complete search history.

(56) References Cited

U.S. PATENT DOCUMENTS

| 7,512,927 B2* | 3/2009 | Gallatin et al. ................. 716/51 |
| 7,698,665 B2* | 4/2010 | Abrams et al. .................. 716/55 |
| 2007/0009808 A1* | 1/2007 | Abrams et al. .................... 430/5 |
| 2008/0127027 A1* | 5/2008 | Gallatin et al. ................. 716/19 |
| 2012/0217421 A1* | 8/2012 | Fujimura et al. ........... 250/492.3 |

OTHER PUBLICATIONS

Mihir Parikh, "Corrections to Proximity Effects in Electron Beam Lithography. I. Theory," J. Appl. Phys. 50(6), Jun. 1979, 1979 American Institute of Physics, pp. 4371-4377.
Mihir Parikh, "Corrections to Proximity Effects in Electron Beam Lithography. II. Implementations," J. Appl. Phys. 50(6), Jun. 1979, 1979 American Institute of Physics, pp. 4378-4382.
Mihir Parikh, Self-Consistent Proximity Effect Correction Technique for Resist Exposure (SPECTRE), J. Va. Sci. Technol., 15(3), May/Jun. 1978, 1978 American Vacuum Society, pp. 931-933.

\* cited by examiner

*Primary Examiner* — Suchin Parihar
(74) *Attorney, Agent, or Firm* — Haynes and Boone, LLP

(57) ABSTRACT

The present disclosure provides one embodiment of an integrated circuit (IC) method. The method includes receiving an IC design layout having a feature; fracturing the feature into a plurality of polygons that includes a first polygon; assigning target points to edges of the first polygon; calculating corrected exposure doses to the first polygon, wherein each of the correct exposure doses is determined based on a respective one of the target points by simulation; determining a polygon exposure dose to the first polygon based on the corrected exposure doses; and preparing a tape-out data for lithography patterning, wherein the tape-out data defines the plurality of polygons and a plurality of polygon exposure doses paired with the plurality of polygons.

20 Claims, 6 Drawing Sheets

METHOD FOR ELECTRON BEAM PROXIMITY CORRECTION WITH IMPROVED CRITICAL DIMENSION ACCURACY

BACKGROUND

The integrated circuit (IC) design is more challenging when semiconductor technologies are continually progressing to smaller feature sizes. The performance of an integrated circuit is seriously influenced by shape and sizes of various features in the IC design. During a lithography process, a feature defined on a mask is deformed due to proximity effect. To enhance the imaging effect when a design pattern is transferred to a semiconductor wafer, optical proximity correction (OPC) is indispensable. The design pattern is adjusted to generate an image on the wafer with improved resolution.

When electron-beam lithography is used to pattern a semiconductor wafer, corresponding proximity correction is implemented for enhanced resolution. However, in the existing method, there are still critical dimension (CD) variations among patterns with different pattern densities.

Therefore, what is needed is a method for proximity correction and lithography process to pattern wafers to reduce the CD variations.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

DETAILED DESCRIPTION

Figure 1:
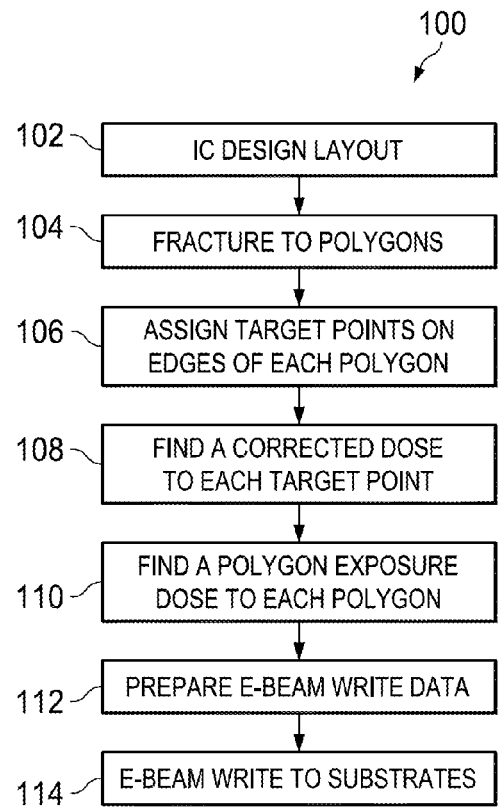
FIG. 1 is a flowchart of an embodiment of a method of a lithography patterning process constructed according to aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

FIG. 1 is a flowchart of a method 100 of a lithography patterning process constructed according to various aspects of the present disclosure in one or more embodiments. The method 100 is described with reference to FIGS. 1 through 10. In the present embodiment, the method 100 is associated with patterning a substrate (such as a semiconductor wafer or a photomask) using electron-beam (e-beam) lithography technology. Accordingly, a resist layer coated on the substrate is an e-beam sensitive resist (or e-beam resist) layer.

The method 100 begins at step 102 by providing or receiving an IC design layout from a designer. In one example, the designer can be a design house. In another example, the designer is a design team separated from a semiconductor manufacturer assigned for making IC products according to the IC design layout. In various embodiments, the semiconductor manufacturer is capable for making photomasks, semiconductor wafers, or both. The IC design layout includes various geometrical patterns designed for an IC product and based on the specification of the IC product.

The IC design layout is presented in one or more data files having the information of the geometrical patterns. In one example, the IC design layout is expressed in a "gds" format known in the art. The designer, based on the specification of the product to be manufactured, implements a proper design procedure to carry out the IC design layout. The design procedure may include logic design, physical design, and/or place and route. As an example, a portion of the IC design layout includes various IC features (also referred to as main features), such as active region, gate electrode, source and drain, metal lines or via of the interlayer interconnection, and openings for bonding pads, to be formed in a semiconductor substrate (such as a silicon wafer) and various material layers disposed over the semiconductor substrate.

The IC design layout may include certain assist features, such as those features for imaging effect, processing enhancement, and/or mask identification information. Those assist features are inserted to the IC design layout by a procedure referred to as geometry proximity correction (GPC) process, similar to an optical proximity correction (OPC) process to an IC design layout to be imaged on a semiconductor substrate by a lithography process using light as radiation energy. The GPC may be implemented in consideration of the environmental impact. The environmental impact includes etching loading effect, the load effect of the lithography patterning or the pattern density of a chemical mechanical polishing (CMP) process.

Figure 2:
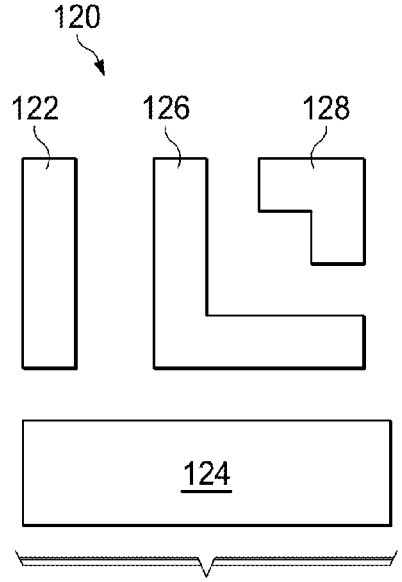
FIGS. 2-3 and 8 are schematic views of an IC design layout at various design stages and constructed according to aspects of the present disclosure.

FIG. 2 is a schematic view of an exemplary IC design layout 120 for illustration. The IC design layout 120 includes a plurality of features, such as features 122, 124, 126 and 128. In one embodiment, the features in the IC design layout 120 are main features. For example, each of the main features is a pattern defining a metal line to be formed on a semiconductor substrate. In another embodiment, the IC design layout 120 includes main features and other features, such as dummy features, to be transferred to a semiconductor wafer. The dummy features are those features inserted to the IC design layout to tune the pattern density for application benefits (such as mechanical stress) and/or fabrication benefits (such as polishing uniformity, etching uniformity, or thermal annealing uniformity). In another embodiment, the IC design layout 120 may additionally include various assist features added for proximity correction or various main features are adjusted/biased (such as resizing, reposition, and/or reshaping) for proximity correction. In various embodiments, the method 100 may include one or operations for inserting dummy features, adding assist features and/or adjusting main features.

Figure 3:
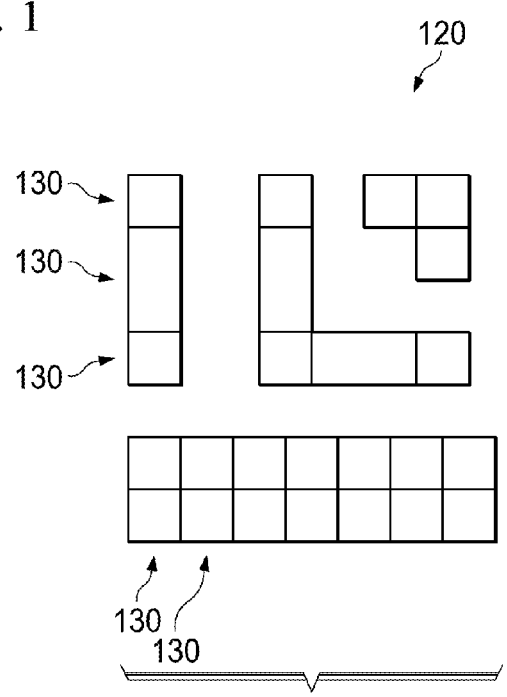
Figure 4:
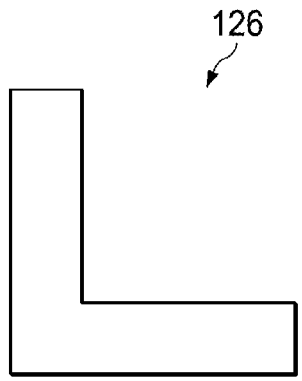
FIGS. 4 and 5 are schematic views of a feature and a plurality of polygons fractured from the feature, respectively, constructed according to aspects of the present disclosure.

The method 100 proceeds to an operation 104 to fracture the IC design layout into a plurality of polygons (or trapezoids) 130 for e-beam lithography process. In the operation 104, various features in the IC design layout 120 are fractured into an IC pattern (still labeled as 120) having the plurality of polygons 130, as illustrated in FIG. 3. The polygons 130 in the IC pattern 120 are defined for a lithography exposure process with a variable exposure dose. In the following operations, various exposure doses are determined for each polygon for proximity correction, which is referred to as e-beam proximity correction (EPC). Alternatively or additionally, the EPC further includes other proximity correction technique. For example, the geometry correction, such as resizing, reposition and/or inserting assist features, may be implemented to the polygons with proximity correction for exposure dose in the following operations or alternatively to the features of the IC design layout before the operation 104, as noted above.

The method 100 and the IC pattern 120 having the plurality of polygons 130 are designed to achieve dose correction for proximity correction during a lithography exposure process, such as an e-beam exposure process. During the e-beam exposure process, the exposure dose changes from polygon to polygon. Each polygon is exposed by the e-beam lithography exposure process with a respective exposure dose, which is generated by subsequent operations. Within a polygon 130, different portions are exposed with a same exposure dose associated with the polygon.

Figure 5:
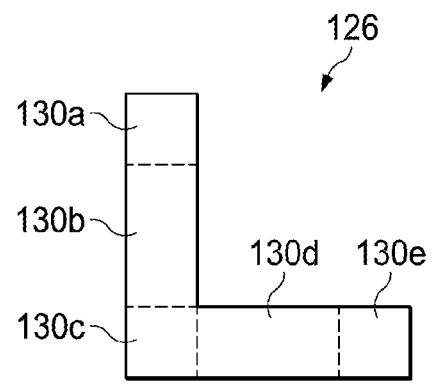
Figure 6:
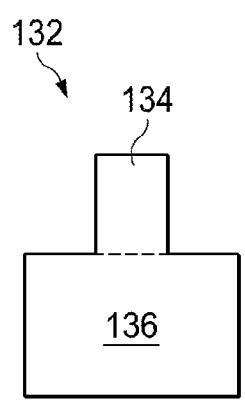
FIGS. 6 and 7 are schematic views of a main feature fractured into a plurality of polygons constructed according to aspects of the present disclosure in various embodiments.

At the operation 104, each feature of the IC design layout 120 may be fractured into one, two or more polygons. The feature 126 of the IC design layout 120 in FIG. 2 is singled out in FIG. 4 for illustration. The feature 126 is fractured into four polygons 130a, 130b, 130c, 130d and 130e, as illustrated in FIG. 5. Those polygons are independently treated during the subsequent operations.

The fracturing operation is implemented according to various factors, such as geometry, pattern density different, and/or CD difference. In one example with reference to FIGS. 4 and 5, the corner portion of the feature 126 is defined as one polygon 130c for geometry consideration (such as corner rounding). In another example illustrated in FIG. 6, a feature 132 includes two portions with different dimensions, therefore is fractured into two polygons 134 and 136. In another example illustrated in FIG. 7, an IC design layout 138 includes features 140, 142 and 144. The features 142 and 144 are disposed on sides of the feature 140. The feature 140 includes a first portion 146 and a second portion 148. The first portion 146 is adjacent to the features 142 and 144, and has a higher pattern density. The second portion 148 has a lower pattern density. Therefore, the feature 140 is fractured into two polygons 146 and 148.

Figure 8:
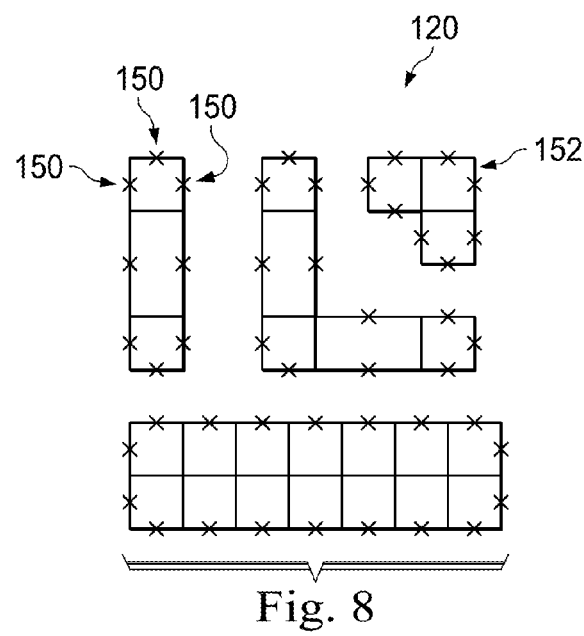

Referring to FIG. 8, the method 100 proceeds to an operation 106 by assigning target points 150 on edges of the polygons 130. The target points 150 are represented by symbol "x" in FIG. 8. The target points 150 are only assigned to the edges of the polygons, therefore also referred to as edge target points. The target points 150 are used to determine the lithography exposure dose in the subsequent operations. In one embodiment, the target points 150 are only assigned to those edges 152 of the polygons 130 that are also edges of the features (such as 122-128) in the IC design layout in FIG. 2. In another embodiment, the edge target points 150 are positioned at the original edges of the features before adjusting/biasing of the corresponding features at the operation 102. Accordingly, those target points are close to the edges of the polygons within a certain range, such as a sub-resolution dimension of an e-beam lithography exposure system to perform the e-beam lithography exposure process. Assigning the target points to the edges of the polygons includes assigning the target points close to the edges of the polygons within a bias ranges, such as the sub-resolution dimension. At least one target point is assigned to a polygon. As illustrated in FIG. 8, multiple target points may be assigned to various edges of a polygon.

The method 100 proceeds to an operation 108 by finding (calculating) a corrected exposure dose to each target point. The operation 108 implements a simulation to simulate the lithography exposure process, thereby finding a simulated lithography exposure intensity profile. The corrected exposure dose is determined based on the simulated lithography exposure intensity at the location of the corresponding target point.

Figure 9:
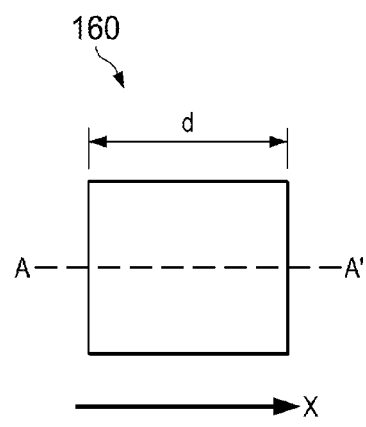
FIG. 9 is a schematic view of a polygon in an IC design layout.
Figure 10:
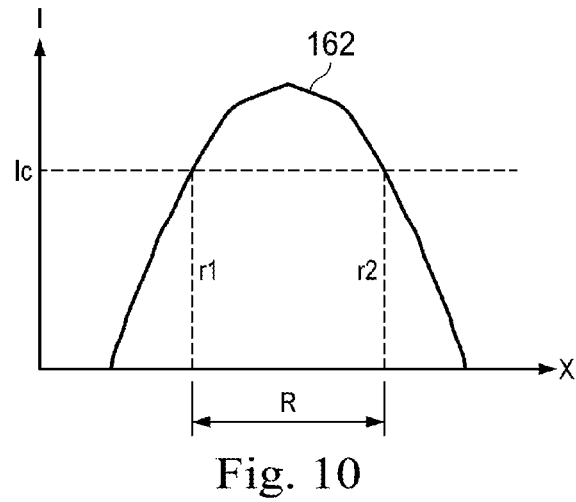
FIG. 10 is a profile of exposure intensity to the polygon of FIG. 9 in a diagrammatical view.

The operation 108 is further described with reference to FIGS. 9 and 10. FIG. 9 is an exemplary polygon 160 and FIG. 10 illustrates the lithography exposure intensity profile 162 of the polygon 160 on a resist layer (e-beam resist layer in the present embodiment). In FIG. 9, the polygon has a dimension d in the X direction. In FIG. 10, the lithography exposure intensity profile 162 is defined as the exposure intensity of the polygon 160 along the dashed line AA', and are obtained by simulation. Especially, the horizontal axis represents location along the X direction, labeled as "X". The vertical axis represents lithography exposure intensity (e-beam intensity in the present embodiment), labeled as "I".

Each resist material has its respective exposure threshold to the exposure radiation (e-beam in the present embodiment). When the exposing intensity is equal to or greater than the exposure threshold, the corresponding portion of the resist is chemically changed such that it will be developed (e.g., it is removed by the developer when the resist is positive tone) in a developing process. When the exposing intensity is less than the exposure threshold, the corresponding portion of the photoresist is not chemically changed to be developed (e.g., it remains during the developing process when the resist is positive tone). It is understood that the term "changed" means that the resist has sufficiently changed to respond differently, e.g., as exposed positive-tone resist responds in the development process. In one example where the resist is positive tone, only portions of the resist exposed with exposing intensity equal to or greater than the exposure threshold are removed by a suitable developer during the developing process. Other portions of the resist unexposed or exposed with exposing intensity less than the exposure threshold remain after the developing process.

Back to FIG. 10, the exposure threshold of the resist layer is labeled as "Ic" and is represented by a dashed line. Assume that the resist layer is a positive tone resist in the present example. This is not limiting but is only for illustration. For a given exposure dose, the exposure intensity is represented by the exposure intensity profile 162. The critical dimension of the polygon is determined by the portion of the resist layer that receives the exposure with exposure intensity equal to or greater than the exposure threshold Ic. In this example, the portion of the resist layer is defined between the location r1 and r2 as illustrated in FIG. 10. Accordingly, the critical dimension (or CD) is defined as the dimension "R" in FIG. 10. When R equals to d, the given exposure dose is a proper exposure dose during the lithography exposure process to image the polygon on the resist layer with the expected CD. Otherwise, the lithography exposure dose is corrected (adjusted) such that the CD requirement is satisfied. Therefore, thus determined an exposure dose is also referred to as a corrected exposure dose.

As noted above, the lithography exposure dose is determined according to the exposure intensity at the target point assigned to the polygon. When a target point is assigned to a location inside the polygon 160 (such as at the center of the polygon 160), the lithography exposure dose is determined according to the exposure intensity at that location. It is further noticed that the exposure intensities at various locations are different. For example, the exposure intensity at the center is greater than the exposure intensity at the edges (such as at r1 and r2). When a target point assigned to a non-edge location of the polygon 160 is used to determine the exposure dose, it can only ensure that the resist material at the location of the target point is properly exposed. It may not ensure the edge portions are properly exposed and it may not ensure that the exposed resist has the expected CD.

In the present embodiment, one or more target points are assigned to the edges of the polygon. In furtherance of the present embodiment, the target points assigned to one polygon are all assigned to the edges of the polygon. Therefore, the target points in the present disclosure are also referred to as edge target points.

The simulation process for the lithography exposure process is based on a simulation model that may be expressed in one or more mathematical formulas, which are further determined by manufacturing data including the tool data of the corresponding lithography exposure system and material data of the resist material.

In the operation 108, a plurality of corrected exposure doses are calculated. Each corrected exposure dose is associated with one target point. Each corrected exposure dose has its individual value. When two or more target points are assigned to one polygon, two or more corrected exposure doses are associated with the polygon. The plurality of corrected exposure doses are paired with the plurality of target points of the polygons 130.

Again, the proximity correction to a polygon may include other parameters, such as size, shape and location, in addition to the exposure dose. For example, according to the simulation result, not only exposure dose to the polygon is varied, but geometry parameters (e.g., shape, size and location) may also varied for proximity correction for desired CD.

The method 100 may proceed to an operation 110 by finding a polygon exposure dose to each polygon 130 of the IC pattern 120. The polygon exposure dose is to be used as the exposure dose to that polygon during the e-beam exposure process. When only one target point is assigned to a polygon, the polygon exposure dose to that polygon is the corrected exposure dose associated with the target point. When a plurality of target points are assigned to a polygon, the polygon exposure dose to that polygon is determined from a plurality of corrected exposure doses associated with the plurality of target points to the polygon. In the present embodiment, the polygon exposure dose to the polygon is determined by averaging the plurality of corrected exposure doses associated with the plurality of target points to the polygon. So it is also referred to as average exposure dose while a corrected exposure dose associated with a target point is also referred to as a point exposure dose.

As noted above, all target points are edge target points in the present embodiment. When the target points to the polygon are not all edge target points, these corrected exposure doses associated with non-edge target points also contribute to the average exposure dose, thereby, the sensitivity of the exposure dose to the exposure intensity at edges is decreased and degraded.

Figure 7:
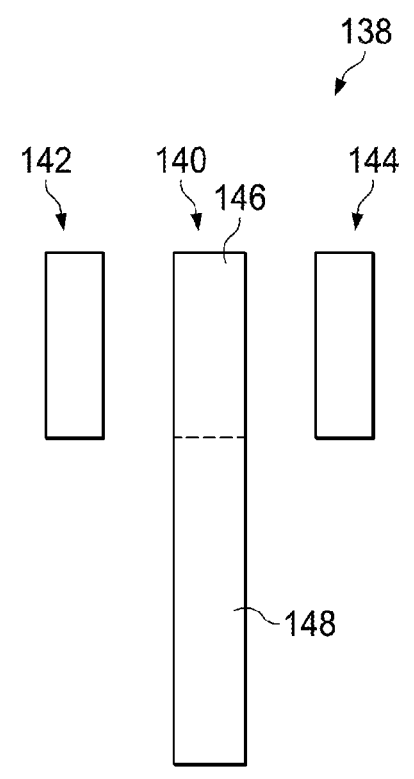

In another embodiment, the averaging process to determine the exposure dose of the polygon is a weighted averaging process. For example, the polygon 148 in FIG. 7 is a rectangle that spans different dimensions in two directions (such as length direction and width direction). A first target point assigned to a longer edge (extending in the length direction) and a second target point assigned to a shorter edge (extending in the width direction) may have different weights during the averaging process. In one particular example, the first CD on the width direction is associated with the exposure intensity at the target point assigned to the longer edge. The second CD on the length direction is associated with the exposure intensity at the target point assigned to the longer edge. Since the first CD is more sensitive to the proximity effect, a greater weight may be given to the target point on the longer edge. In another words, the weight may vary among different target points according to respective edge lengths.

The method 100 proceeds to operation 112 by preparing an e-beam write data (tape-out data) for the e-beam lithography exposure process. The e-beam write data includes an IC pattern defining the plurality of polygons 130 and further includes the polygon exposure doses paired with the polygons 130. Specifically, each polygon is associated with a respective polygon exposure dose. The tape-out data is defined in a proper format for an e-beam exposure process.

The method 100 may further proceed to an operation 114 by applying an e-beam exposure process to one or more substrate using the e-beam write data generated at the operation 112. The e-beam exposure process is implemented in a proper mode, such as a vector write mode. In one embodiment, one or more e-beams are applied to a resist layer coated on a substrate to be patterned to form a latent resist pattern and is further developed to form a patterned resist layer.

Figure 11:
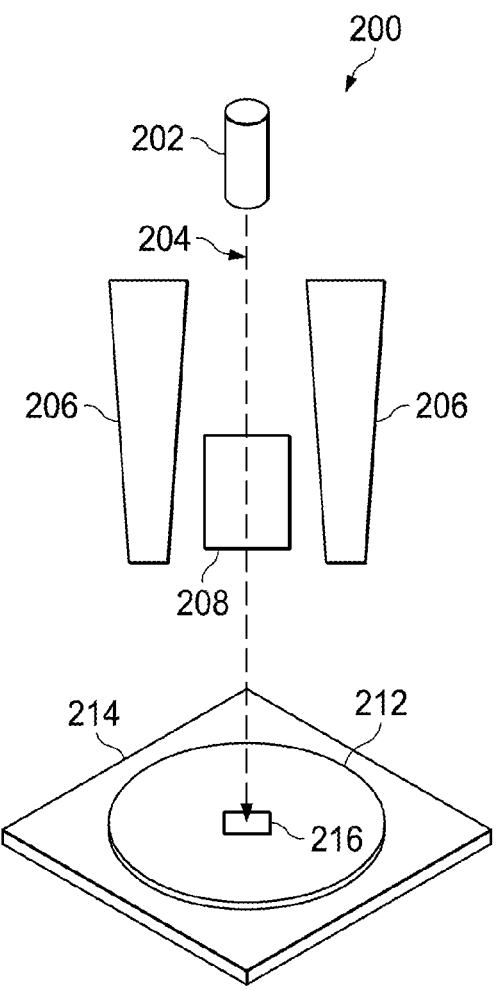
FIG. 11 illustrates a schematic view of a lithography exposure system constructed according to aspects of the present disclosure in one or more embodiment.

The e-beam exposure process is implemented in an e-beam exposure system, such as e-beam exposure system 200 illustrated in FIG. 11 in a schematic view constructed according to aspects in one embodiment. The e-beam exposure system 200 is only one example and is not intended to be limiting. The e-beam exposure system 200 is an electron-based system that utilizes an electron-based imaging.

The e-beam exposure system 200 includes an e-beam source 202 to provide one or more e-beams. In one embodiment, the e-beam source 202 is an electron gun with a mechanism to generate electrons, such as by thermal electron emission. In a particular example, the electron gun includes a tungsten (or other suitable material) filament designed and biased to thermally emit electrons. In FIG. 11, an electron beam 204 is illustrated as an incident electron beam from the source and directed toward a substrate 212 to be patterned.

The e-beam exposure system 200 includes one or more lenses 206 to impact the incident electron beam 204 from the source 202 for imaging effect. In one embodiment, the lenses 206 includes a condenser and further includes an objective lens properly configured. Various lenses, such as magnets, are designed to provide force to the electrons for proper imaging effect, such as focusing.

The e-beam exposure system 200 may include a scanner 208 to deflect the electron beam 204 for scanning a certain region of the substrate 212 in a certain mode, such as vector mode or raster mode. The scanner 208 is operable to direct the electron beam 204 to the substrate 212 positioned on a stage 214. In one example, the scanner 208 may include one or more coils to deflect the electron beam 204 in two orthogonal directions such that the electron beam is scanned over a surface area (a field) 216 of the substrate 212. The substrate 212 is coated with a resist layer sensitive to the e-beam. The operation 114 may further include other process to form a patterned resist layer. Those processes with the e-beam exposure process are collectively referred to as e-beam lithography patterning. For example, the exposed resist layer is further developed to form a patterned resist layer. The e-beam lithography patterning may further include various baking steps.

In one embodiment, the substrate 212 is a semiconductor wafer, such as a silicon wafer. The semiconductor wafer includes a silicon substrate or other proper substrate and material layers formed thereon. Other proper substrate may alternatively be made of some suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (or are formed at subsequent manufacturing steps).

In one example, the patterned resist layer formed by the e-beam lithography patterning is used in an etching process to form various etching regions in the semiconductor wafer. In another example, the patterned resist layer is used in a deposition process, such as chemical vapor deposition (CVD) or physical vapor deposition (PVD), to form a thin film in various regions on the semiconductor wafer, such as in a lift-off process. In another example, the patterned resist layer is used as an ion implantation mask during an ion implantation process that forms various doped regions in the semiconductor wafer.

In another embodiment, the substrate 212 is a mask substrate that includes a transparent material, such as fused quartz. In one embodiment, an e-beam or a mechanism of multiple e-beams is used to form a pattern on a mask substrate based on the IC pattern generated at operation 112. The mask can be formed in various suitable technologies. In one embodiment, the mask is formed using the binary technology. In this case, the mask pattern includes opaque regions and transparent regions. The radiation beam (e.g. ultraviolet or UV beam), used to expose the image sensitive material layer (such as photoresist) coated on a wafer, is blocked by the opaque region and transmits through the transparent regions. In one example, the binary mask includes a transparent substrate (e.g., fused quartz), and an opaque material (e.g., chromium) coated in the opaque regions of the mask. In another embodiment, the mask is formed using a phase shift technology. In the phase shift mask (PSM), various features in the pattern formed on the mask are configured to have proper phase difference to enhance the resolution and imaging quality. In various examples, the PSM can be an attenuated PSM or an alternating PSM known in the art. In yet another example, the mask is a reflective mask used in the extreme violet (EUV) lithography.

In other embodiments, the substrate 212 may include other suitable material, such as glass used to form driving circuit for crystal liquid display technology.

Figure 12:
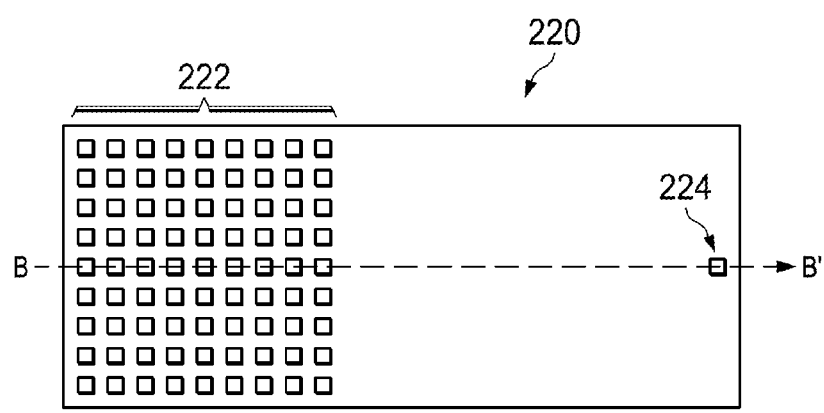
FIG. 12 is a schematic view of an IC pattern constructed according to aspects of the present disclosure in one example.
Figure 13A:
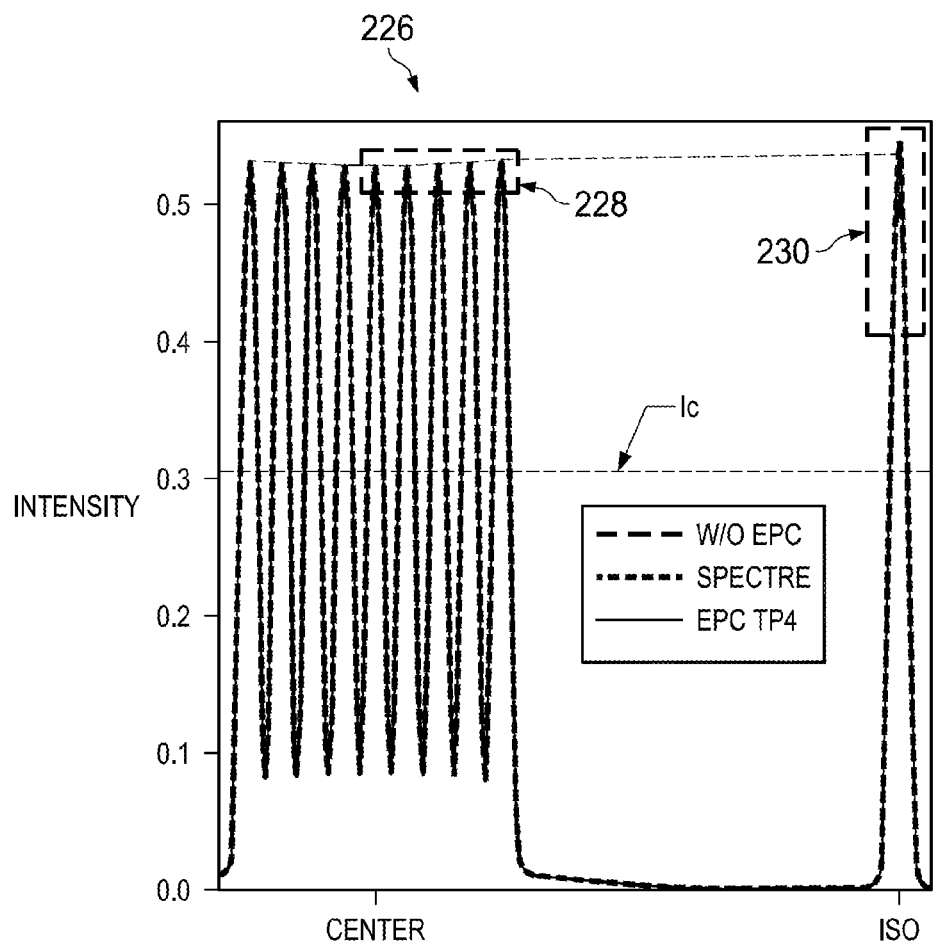
FIGS. 13A-13C illustrate various profiles of exposure intensity to the IC pattern of FIG. 12.

The disclosed method 100 presents various advantages in different embodiments. One example is illustrated in FIGS. 12 and 13A-13C. FIG. 12 is a schematic view of an IC design layout 220 having a plurality of features. Especially, the IC design layout 220 includes dense features 222 and an isolated feature 224. FIG. 13A is a diagrammatical view of various exposure intensity profiles 230 of the IC design layout 220 along the dashed line BB' by different methods. The horizontal axis represents distance along the BB' and the vertical axis represents exposure intensity. The exposure threshold of the corresponding resist layer is labeled as "Ic". A first exposure intensity profile, labeled as "W/O EPC", represents an exposure intensity profile by an e-beam exposure method without using EPC. A second exposure intensity profile, labeled as "SPECTRE", represents an exposure intensity profile by an e-beam exposure method with EPC but the target points are assigned to the corresponding centers of the polygons for the CD>>blur size, or generally calculating the average intensity for entire polygons area.

A third exposure intensity profile, labeled as "EPC TP4", represents an exposure intensity profile by an e-beam exposure method with EPC and the target points are assigned to the edges of the polygons, as defined in the method 100. The exposure intensity profiles include a left region for the dense features 222 and a right region for the isolated feature 224. The center of the dense features 222 is labeled to as "center" and the center of the isolated feature 224 is labeled to as "iso" in FIG. 13A. For better illustration, a portion 228 of the exposure intensity profiles in the left region is zoomed in and illustrated in FIG. 13C and a portion 230 of the exposure intensity profiles in the right region is zoomed in and illustrated in FIG. 13B.

Figure 13B:
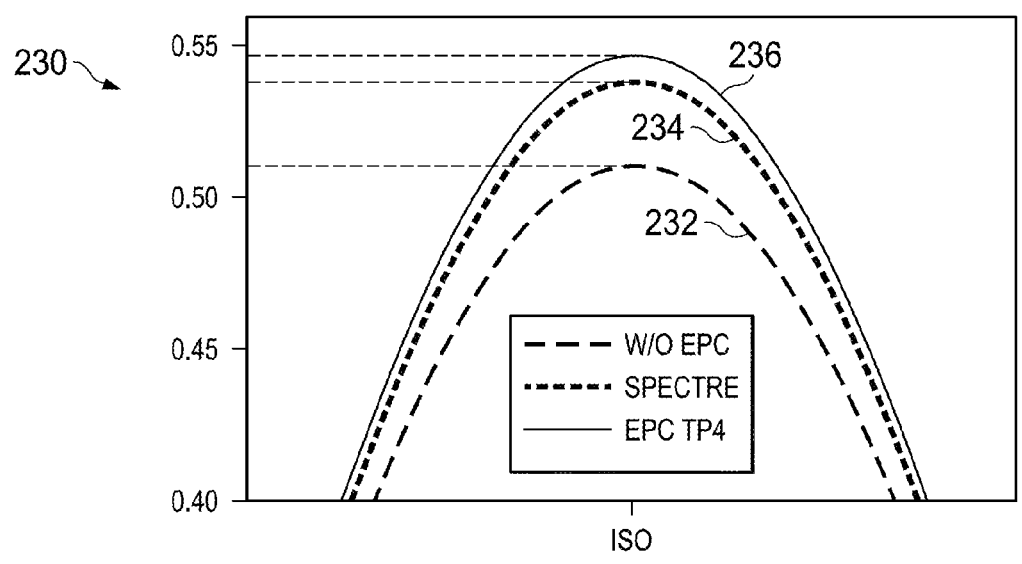
Figure 13C:
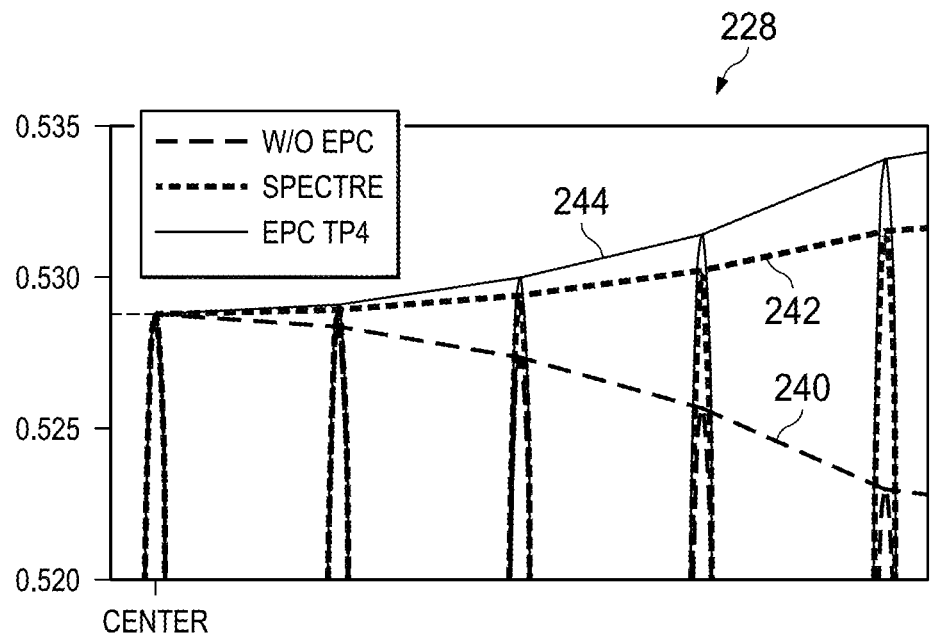

In FIG. 13B for the isolated feature, the exposure intensity profile 232 is "W/O EPC", the exposure intensity profile 234 is "SPECTRE", and the exposure intensity profile 236 is "EPC TP4". For the exposure intensity profile 232 formed in a procedure without EPC, the isolated feature 224 is exposed but the corresponding CD is reduced in the final resist pattern (after being developed). For the exposure intensity profile 234 formed in a procedure with EPC where the average intensity for entire polygons area is calculated, the isolated feature 224 is exposed but the corresponding CD is reduced in the final resist pattern, even though it is improved relative to the case "W/O EPC". For the exposure intensity profile 236 formed in a procedure with EPC where at least one target point is assigned to an edge of the polygon, the isolated feature 224 has exposure intensity tuned by the disclosed method such that the isolated feature 224 is defined in the final resist pattern with proper CD.

Figure 14:
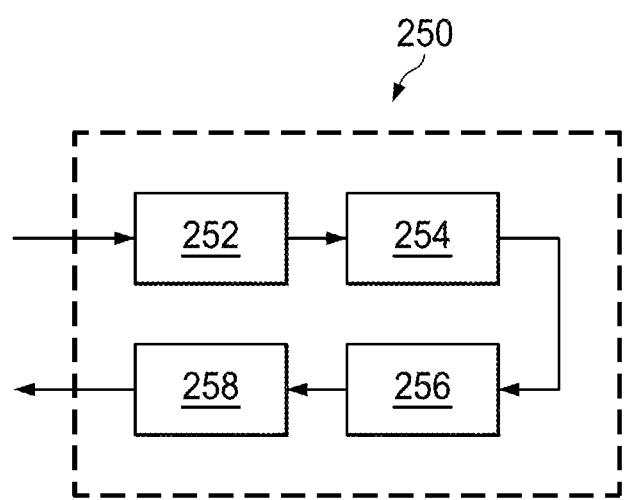
FIG. 14 illustrates a block view of a system to generate a lithography exposure data file to be used by the method of FIG. 1, constructed according to aspects of the present disclosure in one or more embodiment.

FIG. 14 illustrates a schematic view of a tape-out system 250 of generating a tape-out data. The tape-out system 250 includes both hardware and software integrated to perform various actions to generate a tape-out for e-beam writing. In one embodiment, the tape-out system 250 is designed to perform various operations in the method 100 of FIG. 1. In one particular embodiment, the tape-out system 250 is operable to perform fracturing, assigning edge target points, finding corrected exposure dose, and finding polygon exposure dose.

The tape-out system 250 includes a fracturing module 252 designed to fracture the features in the IC design layout into a plurality of polygons according to dose correction. Each polygon is associated with one exposure dose (polygon exposure dose). The fracturing process to IC design layout may be implemented in a rule-based mode. The fracturing module 252 includes various rules for fracturing process or is coupled with a database having those rules. The fracturing module 252 is configured to take an input of an IC design layout and provide an output of an IC design with a plurality of polygons.

The tape-out system 250 includes a target point module 254 designed to assign edge target points to the plurality of polygons in the IC pattern. The assigning of target point may be rule based to assign target points to the edges of the polygons. For example, when a polygon has a side contacting to a side of another polygon and is not an edge of the original feature, no target point is assigned to that side, such as illustrated in FIG. 8. In another example, a target point is assigned to the center of an edge of a polygon.

The tape-out system 250 includes a simulation module 256 designed to perform a simulation process to a polygon of the IC pattern to determine corrected exposure dose to that polygon based on one edge target point associated with the polygon. The simulation module 256 is designed to be capable of e-beam exposure profile to the polygon and is determine a corrected exposure dose based on the CD of the polygon and exposure intensity at the corresponding edge target point. The simulation process may involve a mathematical model with one or more formula defined according to the manufacturing data associated with the e-beam exposure system, which is used to perform the e-beam exposure process to a resist layer based on polygons of the IC pattern. The simulation module 256 includes media storage to keep the simulation model.

The tape-out system 250 includes polygon dose correction module 258 designed to determine a (corrected) polygon exposure dose to a polygon based on one or more corrected exposure doses to one or more edge target points assigned to the polygon. When only one edge target point is assigned to the polygon, the polygon exposure dose is the corrected exposure dose of the edge target point. When multiple (such as 2, 3 or 4) targets points are assigned to edges of the polygons, the polygon exposure dose is an average of the corrected exposure doses associated with the target points. In one example, the average is a weighted average.

Although various embodiments of the present disclosure are provided above. Other embodiments may be present without departure from the spirit of the present disclosure. For example, the radiation energy for the lithography pattern may be alternatively ion beam. In this case, various corrected doses are ion beam exposure doses. In another example, the tape-out system 250 may be a separate entity or may be distributed in existing entities, such as a design/lab facility or an online system. In the present example, the tape-out system 250 is connected to a network, such as the Internet or an intranet. In yet another example, the e-beam exposure system 200 may include a pattern generator to dynamically generate an e-beam pattern and to scan the resist layer for lithography exposure.

In another embodiment, the disclosed method 100 may be directly used in wafer fabrication. For example, e-beam technology, such as e-beam writing, is used to pattern semiconductor wafer. Other embodiments and modifications may be implemented without departing from the spirit of the present disclosure.

Thus, the present disclosure provides an integrated circuit (IC) method. The method includes receiving an IC design layout having a feature; fracturing the feature into a plurality of polygons that includes a first polygon; assigning target points to edges of the first polygon; calculating corrected exposure doses to the first polygon, wherein each of the correct exposure doses is determined based on a respective one of the target points by simulation; determining a first polygon exposure dose to the first polygon based on the corrected exposure doses; and preparing a tape-out data for lithography patterning, wherein the tape-out data defines the plurality of polygons and a plurality of polygon exposure doses paired with the plurality of polygons.

In one embodiment, the IC method further includes coating an electron-sensitive resist layer on a substrate; and performing an electron-beam lithography exposure process to the electron-sensitive resist layer based on the tape-out data with a variable electron-beam dose.

In another embodiment, the performing of the electron-beam lithography exposure process to the electron-sensitive resist layer includes imaging one of the polygons to the electron-sensitive resist layer with a respective electron-beam dose that equals to a respective polygon exposure dose paired with the one of the polygons. In another embodiment, the IC method further includes performing a developing process to the electron-sensitive resist layer to form a patterned resist layer on the substrate.

In another embodiment, the IC method further includes repeating the calculating and the determining to rest of the polygons before the preparing of the tape-out data. In yet another embodiment, the calculating of the corrected exposure doses to the first polygon includes choosing the each one of the exposure doses such that simulated exposure intensity on the target point equals to an exposure threshold of the electron-sensitive resist layer.

In another embodiment, the fracturing of the feature includes dissecting the feature to the plurality of polygons based on at least one of pattern density difference, critical dimension difference and geometry. In yet another embodiment, the determining of the first average exposure dose to the first polygon includes averaging the corrected exposure doses associated with the target points of the first polygon. The averaging the corrected exposure does may include a weighted averaging process to the corrected exposure doses based on edge length.

In yet another embodiment, the assigning the target points to the edges of the first polygon includes assigning the target points only to the edges of the first polygon.

The present disclosure also provides a method for integrated circuit (IC) making in another embodiment. The method includes receiving an IC pattern having a plurality of features; fracturing the features into a plurality of polygons wherein each of the polygons has a respective exposure dose during an electron-beam lithography process to image the IC pattern to an electron-sensitive resist layer; assigning edge target points to the polygons; calculating corrected exposure doses by simulation, each of the corrected exposure doses is associated with one of the edge target points; determining polygon exposure doses based on the corrected exposure doses, wherein each of the polygon exposure doses is associated with one of the polygons; and preparing a tape-out data of the IC pattern for lithography patterning, wherein the tape-out data includes the plurality of polygons and the polygon exposure doses in pairs.

In one embodiment of the method, the determining the polygon exposure doses includes determining a polygon exposure dose to an polygon of the polygons by averaging a subset of the corrected expose doses associated with a subset of the edge target points that are assigned to the polygon.

In another embodiment, the determining of the polygon exposure dose to the polygon includes averaging the subset of the corrected exposed doses. In yet another embodiment, the method further includes forming the electron-sensitive resist layer on a substrate; and performing the electron-beam lithography exposure process to the electron-sensitive resist layer wherein the polygon is exposed with the polygon exposure dose.

In yet another embodiment, the calculating of the corrected exposure doses by simulation includes simulating an exposure process to find an exposure intensity profile; and choosing an exposure dose based on a value of the exposure intensity profile at one of the edge target points relative to exposure threshold of the electron-sensitive resist layer.

In yet another embodiment, the fracturing of the features includes fracturing the features based on at least one of pattern density difference, critical dimension difference and geometry. In yet another embodiment, the determining of the polygon exposure doses includes a weighted averaging process to a subset of the corrected exposure doses associated with a polygon based on edge length.

The present disclosure also provides a method in another embodiment. The method includes coating an electron-sensitive resist layer on a substrate; and performing an electron-beam lithography exposure process to the electron-sensitive resist layer according to an integrated circuit (IC) pattern having a plurality of polygons, wherein the electron-beam lithography exposure process uses respective exposure doses to the polygons, and the plurality of polygons are generated by a procedure that includes receiving an IC design layer having a plurality of features; fracturing the features into a plurality of polygons wherein each of the polygons; assigning edge target points to the polygons; calculating corrected exposure doses by simulation, each of the corrected exposure doses is associated with one of the edge target points; and determining polygon exposure doses based on the corrected exposure doses, wherein each of the polygon exposure doses is associated with one of the polygons.

In one embodiment, the determining polygon exposure doses based on the corrected exposure doses may include determining a first polygon exposure dose by averaging a first subset of the corrected exposure doses; the first subset of the corrected exposure doses is associated with a second subset of the edge target points; and the second subset of the edge target points are assigned to a polygon.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit (IC) method using a tape-out system, comprising:
    receiving an IC design layout having a feature;
    fracturing the feature into a plurality of polygons that includes a first polygon;
    assigning target points to edges of the first polygon;
    calculating corrected exposure doses to the first polygon, wherein each of the corrected exposure doses is determined based on a respective one of the target points different from each other, by simulation using a polygon dose correction module of the tape-out system;
    determining a first polygon exposure dose to the first polygon based on the corrected exposure doses; and
    preparing a tape-out data for lithography patterning, wherein the tape-out data defines the plurality of polygons and a plurality of polygon exposure doses paired with the plurality of polygons.

2. The IC method of claim 1, further comprising:
    coating an electron-sensitive resist layer on a substrate; and
    performing an electron-beam lithography exposure process to the electron-sensitive resist layer based on the tape-out data with a variable electron-beam dose.

3. The IC method of claim 2, wherein the performing of the electron-beam lithography exposure process to the electron-sensitive resist layer includes imaging one of the polygons to the electron-sensitive resist layer with a respective electron-beam dose that equals to a respective polygon exposure dose paired with the one of the polygons.

4. The IC method of claim 2, further comprising performing a developing process to the electron-sensitive resist layer to form a patterned resist layer on the substrate.

5. The IC method of claim 1, further comprising repeating the calculating and the determining to rest of the polygons before the preparing of the tape-out data.

6. The IC method of claim 1, wherein the calculating of the corrected exposure doses to the first polygon includes choosing the each one of the exposure doses such that simulated exposure intensity on the target point equals to an exposure threshold of the electron-sensitive resist layer.

7. The IC method of claim 1, wherein the fracturing of the feature includes dissecting the feature to the plurality of polygons based on at least one of pattern density difference, critical dimension difference and geometry.

8. The IC method of claim 1, wherein the determining of the first polygon exposure dose to the first polygon includes averaging the corrected exposure doses associated with the target points of the first polygon.

9. The IC method of claim 1, wherein the averaging the corrected exposure doses includes a weighted averaging process to the corrected exposure doses based on edge length.

10. The IC method of claim 1, wherein the assigning the target points to the edges of the first polygon includes assigning the target points only to the edges of the first polygon.

11. A method for making an integrated circuit (IC) using a tape-out system, comprising:
    receiving an IC pattern having a plurality of features;
    fracturing the features into a plurality of polygons wherein each of the polygons has a respective exposure dose during an electron-beam lithography exposure process to image the IC pattern to an electron-sensitive resist layer;
    assigning edge target points to the polygons;
    calculating corrected exposure doses by simulation, each of the corrected exposure doses is associated with only one of the edge target points, by a polygon dose correction module of the tape-out system;
    determining polygon exposure doses based on the corrected exposure doses, wherein each of the polygon exposure doses is associated with one of the polygons; and
    preparing a tape-out data of the IC pattern for lithography patterning, wherein the tape-out data includes the plurality of polygons and the polygon exposure doses in pairs.

12. The method of claim 11, wherein the determining the polygon exposure doses includes determining an polygon exposure dose to an polygon of the polygons by averaging a subset of the corrected expose doses associated with a subset of the edge target points that are assigned to the polygon.

13. The method of claim 12, wherein the determining of the polygon exposure dose to the polygon includes averaging the subset of the corrected exposed doses.

14. The method of claim 12, further comprising:
    forming the electron-sensitive resist layer on a substrate; and
    performing the electron-beam lithography exposure process to the electron-sensitive resist layer wherein the polygon is exposed with the polygon exposure dose.

15. The method of claim 11, wherein the calculating of the corrected exposure doses by simulation includes:
    simulating an exposure process to find an exposure intensity profile; and choosing an exposure dose based on a value of the exposure intensity profile at one of the edge target points relative to exposure threshold of the electron-sensitive resist layer.

16. The method of claim 11, wherein the fracturing of the features includes fracturing the features based on at least one of pattern density difference, critical dimension difference and geometry.

17. The method of claim 11, wherein the determining of the polygon exposure doses includes a weighted averaging process to a subset of the corrected exposure doses associated with a polygon based on edge length.

18. A method, comprising:
coating an electron-sensitive resist layer on a substrate; and
performing an electron-beam lithography exposure process to the electron-sensitive resist layer according to an integrated circuit (IC) pattern having a plurality of polygons, wherein the electron-beam lithography exposure process uses respective exposure doses to the polygons, and the plurality of polygons are generated by a procedure that includes
receiving an IC design layer having a plurality of features;
fracturing the features into a plurality of polygons;
assigning edge target points to the polygons;
calculating corrected exposure doses by simulation, wherein each of the corrected exposure doses is associated with only one of the edge target points; and
determining polygon exposure doses based on the corrected exposure doses, wherein each of the polygon exposure doses is associated with one of the polygons.

19. The method of claim 18, wherein
the determining the polygon exposure doses based on the corrected exposure doses includes determining a first polygon exposure dose by averaging a first subset of the corrected exposure doses;
the first subset of the corrected exposure doses is associated with a second subset of the edge target points; and
the second subset of the edge target points are assigned to a polygon.

20. The method of claim 18, after the performing of the electron-beam lithography exposure process, further comprising performing a developing process to the electron-sensitive resist layer, thereby forming a patterned resist layer.

* * * * *